United States Patent [19]
Robbins

[11] Patent Number: 5,266,527
[45] Date of Patent: Nov. 30, 1993

[54] CONFORMAL WAFER CHUCK FOR PLASMA PROCESSING HAVING A NON-PLANAR SURFACE

[75] Inventor: Roger A. Robbins, Allen, Tex.

[73] Assignee: Texas Instruments Incorporated, Dallas, Tex.

[21] Appl. No.: 761,202

[22] Filed: Sep. 17, 1991

[51] Int. Cl.$^5$ ............... H01L 21/00; H01L 21/02; H01L 21/302; H01L 21/463
[52] U.S. Cl. ............... 437/225; 437/228; 156/643; 118/620; 118/728
[58] Field of Search ............... 437/225, 228; 156/643; 118/620, 728

[56] References Cited

U.S. PATENT DOCUMENTS 4,685,999  8/1987  Davis et al. ............ 156/643

*Primary Examiner*—Brian E. Hearn
*Assistant Examiner*—B. Everhart
*Attorney, Agent, or Firm*—Stanton C. Braden; Richard Donaldson

[57] ABSTRACT

A method of processing a semiconductor wafer using a wafer chuck having a first end with a non-planar surface, the non-planar surface shaped such that a wafer supported at a plurality of points about its periphery will have a uniform pressure between its surface and the non-planar surface, and pressing a surface of the wafer against the non-planar surface of the wafer chuck.

9 Claims, 5 Drawing Sheets

CONFORMAL WAFER CHUCK FOR PLASMA PROCESSING HAVING A NON-PLANAR SURFACE

FIELD OF THE INVENTION

This invention relates to the field of semiconductor wafer processing and more particularly to plasma processing of semiconductor wafers.

BACKGROUND OF THE INVENTION

In the semiconductor industry, process uniformity is extremely important, particularly as wafer sizes increase and device geometries become smaller. One approach to improving uniformity is single wafer processing, since the environment in which the wafer is processed can be more tightly controlled than in batch processing. Even in the controlled environment of single wafer processing, however, control and uniformity of wafer temperature is difficult.

In general, semiconductor wafer dry processing is conducted in process mediums at reduced pressures. This reduces the thermal conduction through the process gasses. Wafer temperature control must therefore be obtained through wafer contact conduction in some manner.

One common prior art method of mounting a wafer in a dry processing low-pressure process chamber is to simply place it face up on a flat chuck with no clamping. While this method is simple and has no clamping mechanisms to interfere with gas flow uniformity, heat conduction between the wafer and the chuck is poor. The major heat path between wafer and chuck is surface contact conduction, which is poor due to non-uniformity in contact patterns between chuck and wafer. This results in non-uniformity of temperature across the wafer. Convection and conduction through the process gas is minimal because of the low density of the gas in the process chamber.

While there is some radiation between the wafer and its environment, the temperature of the wafer depends mainly on its conduction paths to the chuck. Since it is well known that surface-to-surface thermal conduction is proportional to contact pressure, any mismatch in surface planarity between chuck and wafer will interfere with heat conduction. This also contributes to the temperature difference between the chuck and the wafer.

A number of methods of damping the wafer at its edge in order to improve wafer to chuck contact have been used, such as pins and ring clamps. Merely clamping the wafer at its circumference against a flat chuck will not produce uniform thermal contact between the wafer and the chuck. This is caused by the fact that contact pressure between the wafer and the substrate is not uniform across the wafer. Contact pressure between the wafer and the chuck will be high under the clamp, but will be lighter or zero under non-clamped portions of the wafer. The temperature of the peripherally clamped wafer is better controlled, but is still not uniform from the center to the edge of the wafer.

Another approach is to clamp the wafer against a chuck having a spherically domed surface using a full periphery clamp. This is an attempt to force the wafer against the chuck using the spring force of the wafer itself. The major disadvantage of this method is that it requires a full circumferential damp, which disturbs gas delivery uniformity and therefore contributes to non-uniformity near the edges of the wafer. In addition, the sperical dome shape is not the proper shape for a naturally deformed circular membrane in the form of a wafer. Since it is not the proper shape the wafer-chuck contact pressure is non-uniform, leading to non-uniform thermal contact, and thus to non-uniform wafer temperature.

Since surface contact conduction depends on the area of actual material to material contact, and the total area available for contact between the backside of a wafer and its chuck is on the order of 10% due to surface irregularity, even surface conduction is limited.

In order to overcome this inherent limitation in contact conduction, a helium chuck has also been used. The helium chuck utilizes the concept of thermal conduction from the wafer through a "high pressure", high conductivity gas (such as Helium, Argon, or some other inert gas) trapped between the wafer and the chuck. This has been shown to perform well, but requires a gas seal between the wafer and chuck.

The requirement for a seal leads to a different set of problems affecting temperature uniformity of the wafer. Seal material compatibility, limited pressure due to leaks, or non-uniform gas flow patterns all lead to control limitations and non-uniformities in the temperature profile of the wafer.

In order to provide a seal which holds the gas between the wafer and the chuck, an O-ring seal is used. The seal is generally slowly eaten up during processing, and particles from the seal contaminate the wafer. At high pressure, the material of the seal deteriorates and sticks to the wafer, which causes handling problems. In addition, the wafer bows upwards in a dome shape as the Helium pressure is increased. This causes total loss of contact except at the wafer clamping points and also causes variation in RF coupling between the wafer and the substrate electrode.

SUMMARY OF THE INVENTION

In accordance with the present invention, there is shown a conformal wafer chuck for semiconductor wafer processing. The preferred embodiment of the chuck comprises a rigid body having opposed first and second ends, the first end being shaped to conform to the shape of a semiconductor wafer supported at a plurality of points about its periphery, the shape being such that the spring forces of the wafer exert approximately equal pressure against the first end across the backside of the wafer.

There is also shown a method of processing a wafer, comprising the steps of disposing the wafer in a process chamber, providing a wafer chuck in the process chamber, the chuck having a first end with a non-planar surface, the non-planar surface shaped such that a wafer supported at a plurality of points about its periphery will have a uniform pressure between its surface and the non-planar surface, and pressing a surface of the wafer against the non-planar surface of the wafer chuck.

DESCRIPTION OF THE PREFERRED EMBODIMENT

There is presented a conformal wafer chuck having a shape such that all areas of the wafer contact the surface of the chuck with approximately the same pressure. The surface of the chuck is formed in a three-dimensional shape which causes a slight bending of the wafer as shown in FIG. 2.

Figure 1:
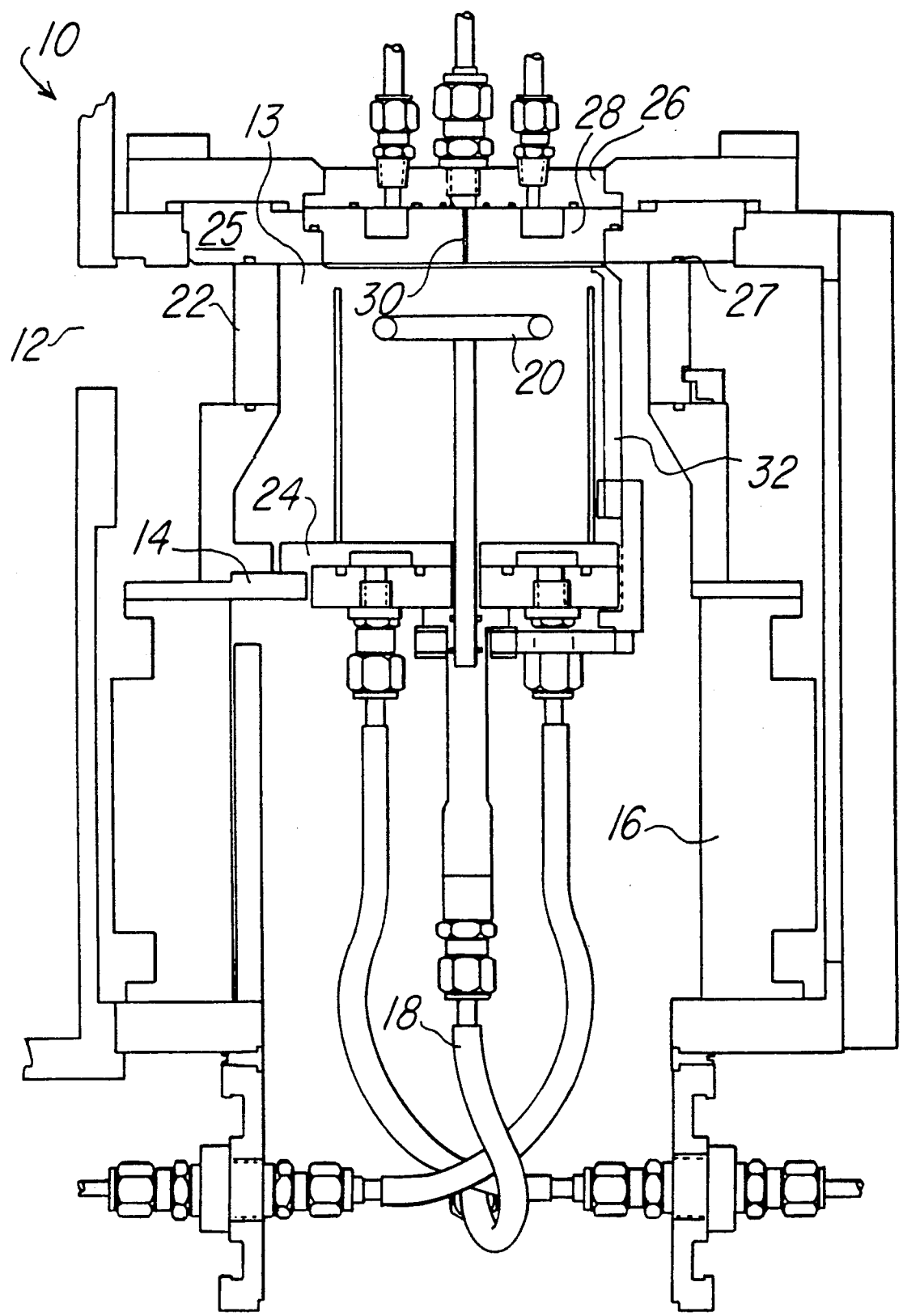
FIG. 1 is a cross-section of a processing chamber with the present invention.

Referring to FIG. 1, there is shown a vacuum process chamber 10, of the type with which the present invention is used. The process chamber 10 has an opening 12 which through which wafers to be processed can be placed within and removed from chamber 10 before and after processing. The chamber 10 also has a base plate 14 which is supported by a bellows assembly 16. Process gas supply lines 18 extend into the interior of chamber 10 through the base plate 14. The chamber 10 also has a process gas distributor 20, and can include such things as a cylinder 22 to assist in confining process gases to the desired area. The chamber 10 also has a ground electrode 24.

At the top of chamber 10 is an RF electrode 26. The wafer chuck 28 of the present invention is attached to the RF electrode 26. Extending through the top of chamber 10 and through the chuck 28 is a gas feed line 30.

The chamber 10 also has a plurality of wafer support pins 32. For clarity of the drawing, only one support pin 32 is shown. In the preferred embodiment three support pins 32 are used, spaced so that they contact the wafer adjacent its edge, and are spaced approximately equally around the periphery of the wafer. While in the preferred embodiment three support pins 32 are used, a larger number could also be used.

The support pins 32 are resiliently supported at one end, and are adapted to support a wafer at the other end.

The entire lower assembly, including base plate 14, gas supply lines 18, gas distributor 20, cylinder 22, ground electrode 24 and wafer support pins 32 are all movable upward toward electrode 26, through the action of bellows assembly 16. The bellows assembly allows this vertical motion to occur while maintaining a vacuum tight interface to the interior of chamber 10.

When the lower assembly is in its upper position, cylinder 22 is in sealing engagement with the upper plate 25, providing a vacuum-sealed chamber surrounded by cylinder 22. The seal is made with an o-ring 27.

To process a wafer in chamber 10, the wafer is passed through opening 12 is opened and placed on support pins 32. Once the wafer is placed in the chamber 10, gate 12 is closed with some type of gate (not shown) and the lower assembly is moved vertically upward. As the assembly moves upward, the backside of the wafer is pressed against the conformal chuck 28. The springs resiliently supporting the lower end of pins 32 provide the necessary force to press the wafer against chuck 28 with the desired amount of force. Once the lower assembly is in the proper position, the desired processing can take place.

The chamber 10 also has the necessary gas passages and exhaust outlets for input of process gases and exhausting byproducts from the chamber during and after wafer processing. The chamber 10 also has the necessary plumbing for lowering the pressure in the interior 13 of chamber 10 to the desirable pressure for wafer processing. Other necessary attachments to chamber 10, such as a UV source heating source, while not shown and described, can be added to chamber 10 as necessary for a particular process.

As shown in FIG. 1, the chuck 28 has a gas delivery tube 30 for delivering an inert gas between the wafer and conformal surface of chuck 28. In the preferred embodiment, the chuck 28 has grooves (not shown) in conformal surface through which an inert gas can flow when introduced through delivery tube 30. Alternatively, the conformal surface may be ungrooved.

Figure 2A:
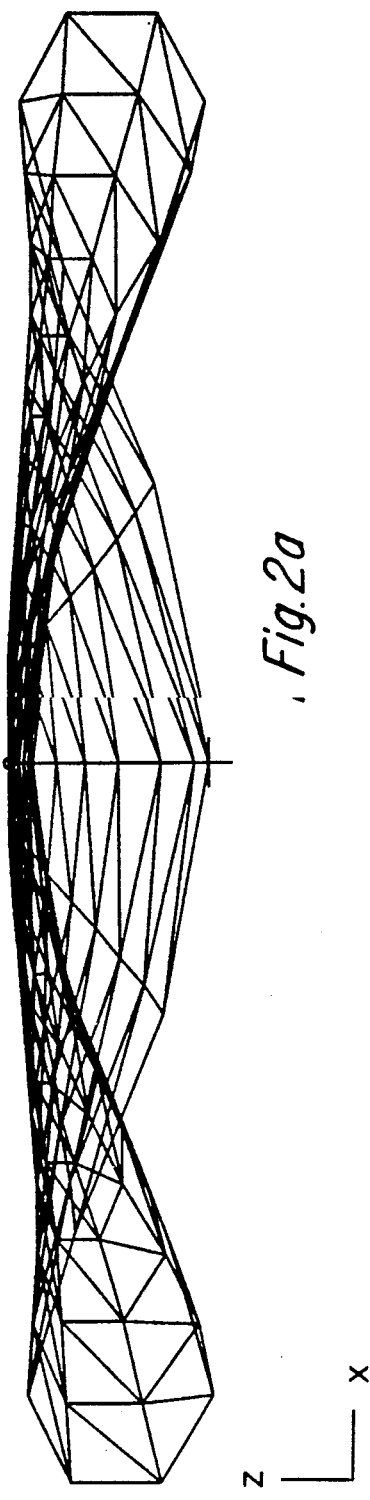
FIG. 2a is a wire frame side view of a wafer when pressed against the conformal chuck of the present invention.
Figure 2B:
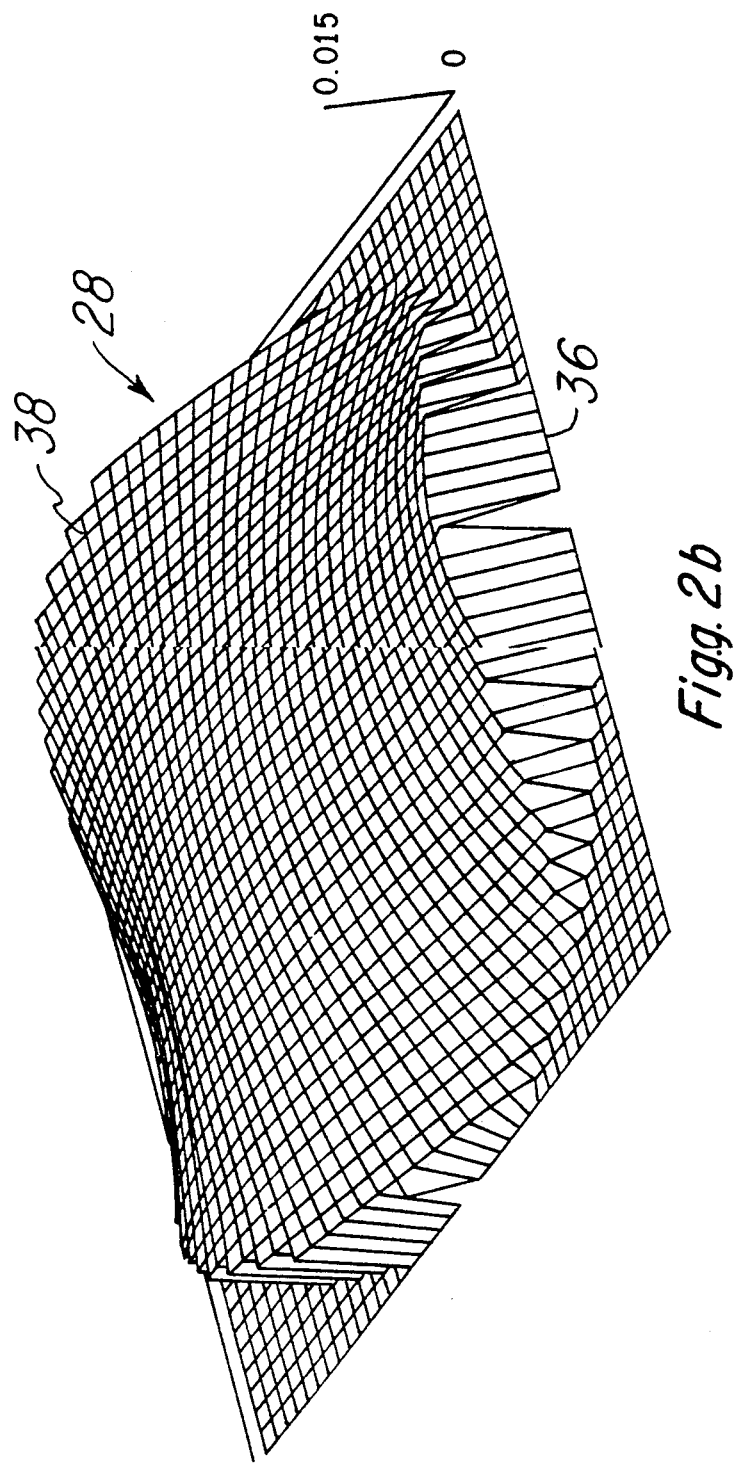
FIG. 2b is a perspective wire frame view of the conformal chuck.

The chuck 28 (not to scale) is shown in FIG. 2b, and has an outer surface 36 and a conformal wafer engaging surface 38. The wafer engaging surface 38 is shaped to accommodate a wafer when it is supported by pins 32. The planarity of the chuck 28 is modified in such a manner as to force all areas of the wafer to contact surface 38 with substantially the same pressure. Since the wafer is not supported across the entire face, but is only supported at three points around its periphery in the preferred embodiment, there is some deformation of the wafer when it is pressed against the chuck, as shown in FIG. 2(a) (not to scale). The "warp" shape is such that the pins force the wafer into the depressions in the chuck. The natural spring force in the wafer forces it against the chuck in all areas, including between the support pins 32 at a substantially equal pressure.

Figure 3:
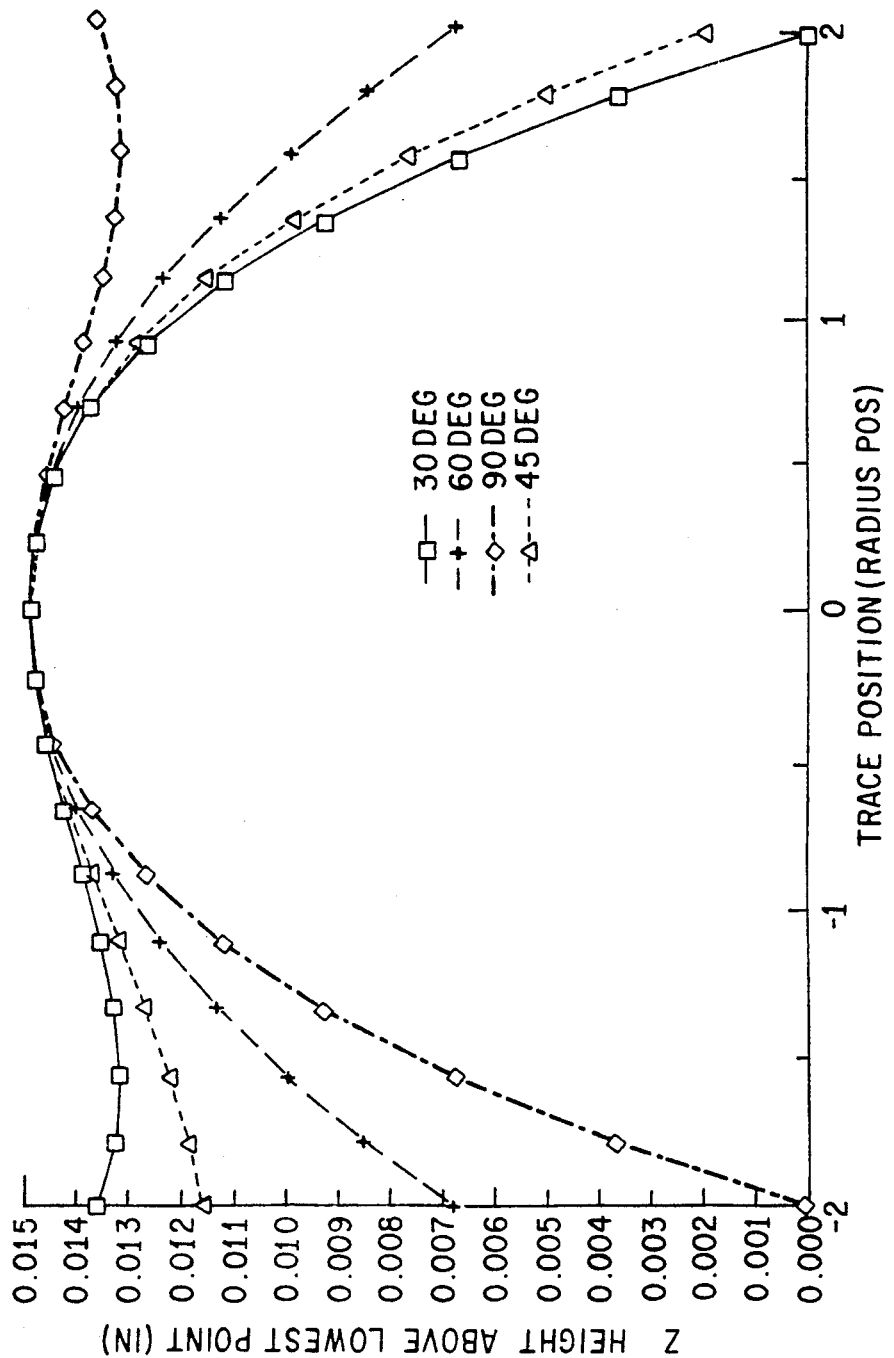
FIG. 3 is a graph showing surface height along a diameter of the chuck for a denoted angle referenced to the node grid.
Figure 4:
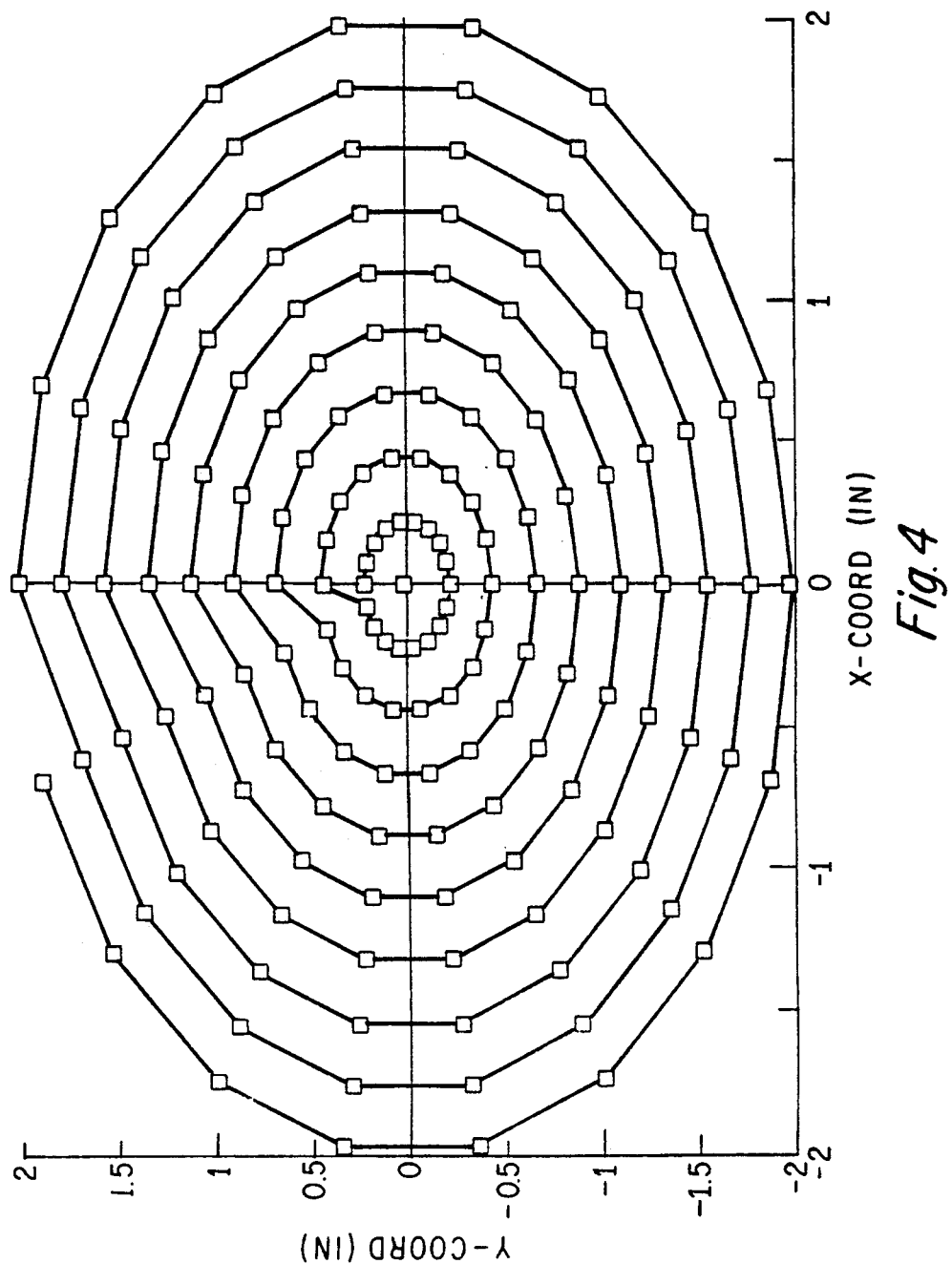
FIG. 4 is a node grid for a 4" wafer for finite element stress analysis.

The deflection of the surface of the wafer as shown in FIG. 2(a) is shown graphically in FIG. 3 for a wafer supported at three points about its periphery. The Z-coordinate (height) along a diameter of a denoted angle in FIG. 3 is referenced to the node grid shown in FIG. 4. As an example, the trace labeled "30 deg" is taken along a line perpendicular with the 'Z-axis', lying in the plane of the wafer at one of the support pins. The other two support points are located at 150 deg. and at 270 deg.

The shape of the warp in the wafer is determined by considering the deformation of the wafer under uniform pressures such that the total force exerted against the back side of the wafer equals the total clamping force exerted by support pins 32. This pressure can be considered to be somewhat like an "enhanced gravity", weighing down the wafer, and causing it to droop around the support Pins 32. The advantage offered by the present invention is that the shape of the conformal chuck allows the spring forces in the wafer to produce uniform pressure between wafer and chuck 28 and whose total force equals the clamping force. This uniform clamping pressure creates a substantially uniform thermal contact path between wafer and chuck at all points on the wafer, and results in a controlled and uniform temperature profile across the wafer.

Since the wafer contacts the chuck 28 at all points with substantially uniform pressure, a helium chuck can be manufactured from this shape with no special seal for the backside cooling gas, and the freedom to achieve a higher cooling gas pressure for greater cooling capacity is achieved. No wafer orientation is required other than to ensure that the clamping pins do not fall off the wafer flat.

The shape of the preferred embodiment is arrived at using a finite element analysis program for membrane stress analysis. The general boundary conditions in the preferred embodiment are set for three point supports, slightly in from the edge, where the wafer is free to rotate (around the x and y axes, not the z axis) at the supports and the circumference of the wafer. The bowing force consists of a uniform pressure over the surface of the wafer which is set at a somewhat greater value than the expected helium chuck helium pressure. This allows for variations in wafer thickness and is intended to insure that the wafer maintains contact with the chuck as well as maintaining a seal at the circumference for the helium between the wafer and the chuck. It is also to be understood that the conditions for other embodiments could include n point supports, rather than three.

As stated above, FIG. 3 describes the result of finite element analysis for a 4" wafer having a three pin support. The figure shows the Z-coordinate (height) above what would be a planar surface along a diameter of a denoted angle referenced to the node grid illustrated in FIG. 4.

Figure 5:
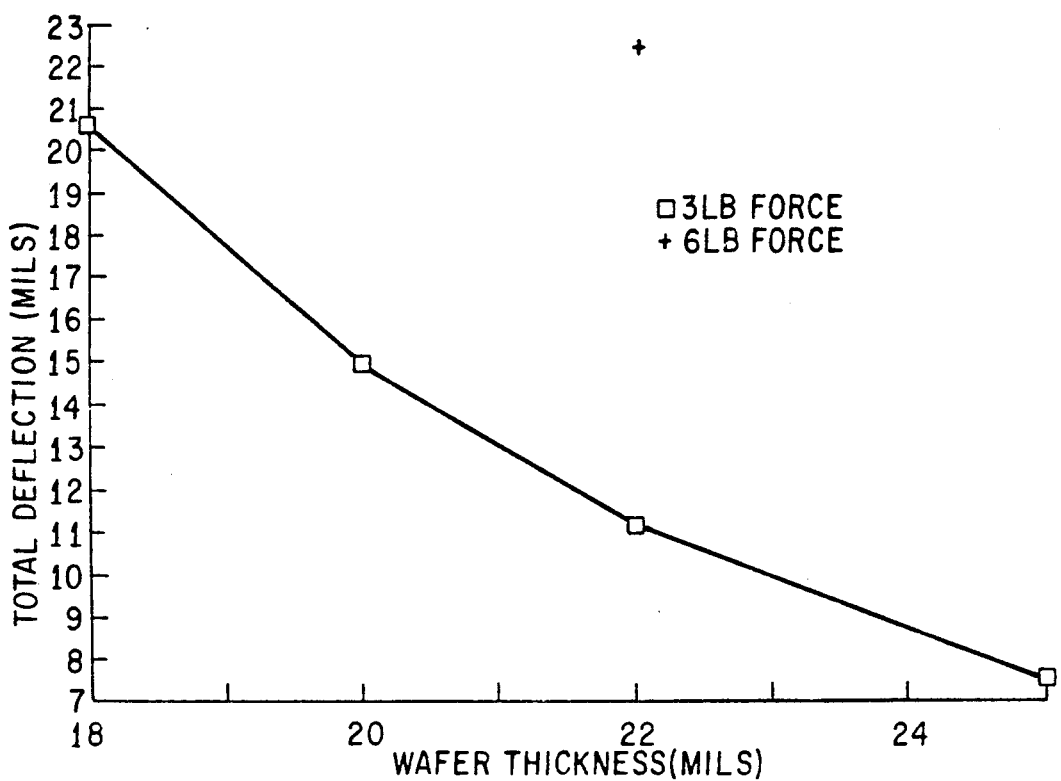
FIG. 5 is a graph showing required warp amplitude for uniform contact pressure as a function of wafer thickness.

For a given clamping force, the amount of warp in a wafer varies with the thickness of the wafer, as shown in FIG. 5. The spring rate of the wafer changes with changes in wafer thickness, and as shown, the total deflection decreases with an increase in wafer thickness. Thus, for a thicker wafer, the height shown in FIG. 4 would be less than for a thinner wafer.

In the preferred embodiment the formula for height above the lowest point on the circumference (Z-coordinate) is as follows:

$$f(r,\theta) = A*Jo(h*r) - k*r^3*\sin(3*\theta)$$

In the above formula, for a 4 in. diameter wafer bowed with a pressure of 12 Torr, r is the radius in the wafer plane, A is the "warp" amplitude at its max, (A=0.015 in.), $kr^3$ is the "warp" amplitude at any radius r, (k=0.000858 in.), $\theta$ is the angle from the center of the wafer to points on the circumference in relation to a fixed starting line through the center (0-360 degrees), Jo is the "zero order Bessel function of the first kind" and h is a fitting constant (h=0.799).

The shape allows the spring forces in the wafer to produce uniform pressure between wafer and chuck and whose total force equals the clamping force. The uniform contact pressure creates a uniform thermal contact conduction path between wafer and chuck at all points on the wafer, and results in a controlled and uniform temperature profile across the wafer.

In addition, since the wafer contacts the chuck at all points with uniform pressure, a helium chuck embodiment can be manufactured from this shape with no special seal for the backside cooling gas and a higher cooling gas pressure for greater cooling capacity can be obtained. No wafer orientation is required other than to ensure that the clamping pins do not fall off the wafer flat.

The surface of the chuck 28 can be formed simply by feeding the output from the finite element analysis program into a computer controlled milling machine to machine the surface.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

I claim:

1. A method of processing a wafer, comprising the steps of:

disposing the wafer in a process chamber;

providing a wafer chuck in the process chamber, the chuck having a first end with a non-planar surface, the non-planar surface shaped such that a wafer supported at a plurality of points about its periphery will have a uniform pressure between its surface and the non-planar surface; and pressing a surface of the wafer against the non-planar surface of the wafer chuck, such that the spring forces of the wafer exert substantially equal pressure between the surface of the wafer and the non-planar surface of the wafer chuck.

2. The method of claim 1, further comprising the step of:

performing a processing step on the wafer.

3. The method of claim 1, further comprising the step of:

providing grooves in the non-planar surface.

4. The method of claim 3, further comprising the step of:

introducing a gas between the non-planar surface and the surface of the wafer through the grooves.

5. A method of processing a semiconductor wafer, comprising the steps of:

mounting a wafer chuck in a processing chamber, the wafer chuck having a non-planar surface adapted to receive the backside of a semiconductor wafer;

supporting the wafer at a plurality of points adjacent the periphery of the wafer; and pressing the wafer against the non-planar surface of the chuck such that there is substantial equal pressure between the non-planar surface of the chuck and the backside of the wafer at substantially all points on the wafer, caused by the spring forces in the wafer.

6. A method of processing a semiconductor wafer, comprising the steps of:

mounting a wafer chuck in a processing chamber, the wafer chuck having a non-planar surface, the surface being defined by the formula $f(r,\theta)=A*Jo(h*r)-k*r^3*\sin(3*\theta)$, said surface being adapted to receive the backside of a semiconductor wafer;

supporting the wafer at a plurality of points adjacent the periphery of the wafer; and pressing the wafer against the chuck such that there is substantially equal pressure between the chuck and the backside of the wafer at substantially all points on the wafer.

7. The method of claim 6, further comprising the step of:

performing a processing step on the wafer.

8. The method of claim 6, further comprising the step of:

providing grooves in the non-planar surface.

9. The method of claim 6, further comprising the step of:

introducing a gas between the non-planar surface and the surface of the wafer through the grooves.

* * * * *